United States Patent [19]
Allen et al.

[11] Patent Number: 4,623,990
[45] Date of Patent: Nov. 18, 1986

[54] DUAL-PORT READ/WRITE RAM WITH SINGLE ARRAY

[75] Inventors: Michael Allen, San Francisco; Lee Hirsch, Mountain View, both of Calif.

[73] Assignee: Advanced Micro Devices, Inc., Sunnyvale, Calif.

[21] Appl. No.: 667,022

[22] Filed: Oct. 31, 1984

[51] Int. Cl.$^4$ .............................................. G11C 7/00
[52] U.S. Cl. ................................... 365/189; 365/230
[58] Field of Search .............. 365/189, 193, 194, 230, 365/233

[56] References Cited

U.S. PATENT DOCUMENTS 4,287,575 9/1981 Eardley et al. ................. 365/189 X
4,541,076 9/1985 Bowers et al. .................. 365/189 X

OTHER PUBLICATIONS

J. R. Reinert et al., "A 32×9 ECL Dual Address Register Using an Interleaving Cell Technique", 1977 IEEE International Solid-State Circuit Conference, Feb. 16, 1977.

Primary Examiner—Joseph A. Popek
Attorney, Agent, or Firm—Patrick T. King; Kenneth B. Salomon; J. Vincent Tortolano

[57] ABSTRACT

A single-array memory employs a novel storage cell providing dual read/write access via either an "A"-side or a "B"-side. The storage cell uses a unique circuit in which read current is borrowed during writing into the cell. Asymmetrical read/write delay circuitry is provided to avoid overwriting the contents of a storage cell during the read-to-write transition. Row-selection decoders use Schottky-clamping diodes in a way which provide an equivalent oscillation-damping capacitance at the base of the selected-row driver transistor. The single-array memory can be advantageously used as part of a single-chip VLSI four-port register file permitting simultaneous reading and/or writing of registers from any of two read ports or two write ports, respectively. Unidirectional busses connect each storage cell to each of the four ports.

10 Claims, 12 Drawing Figures

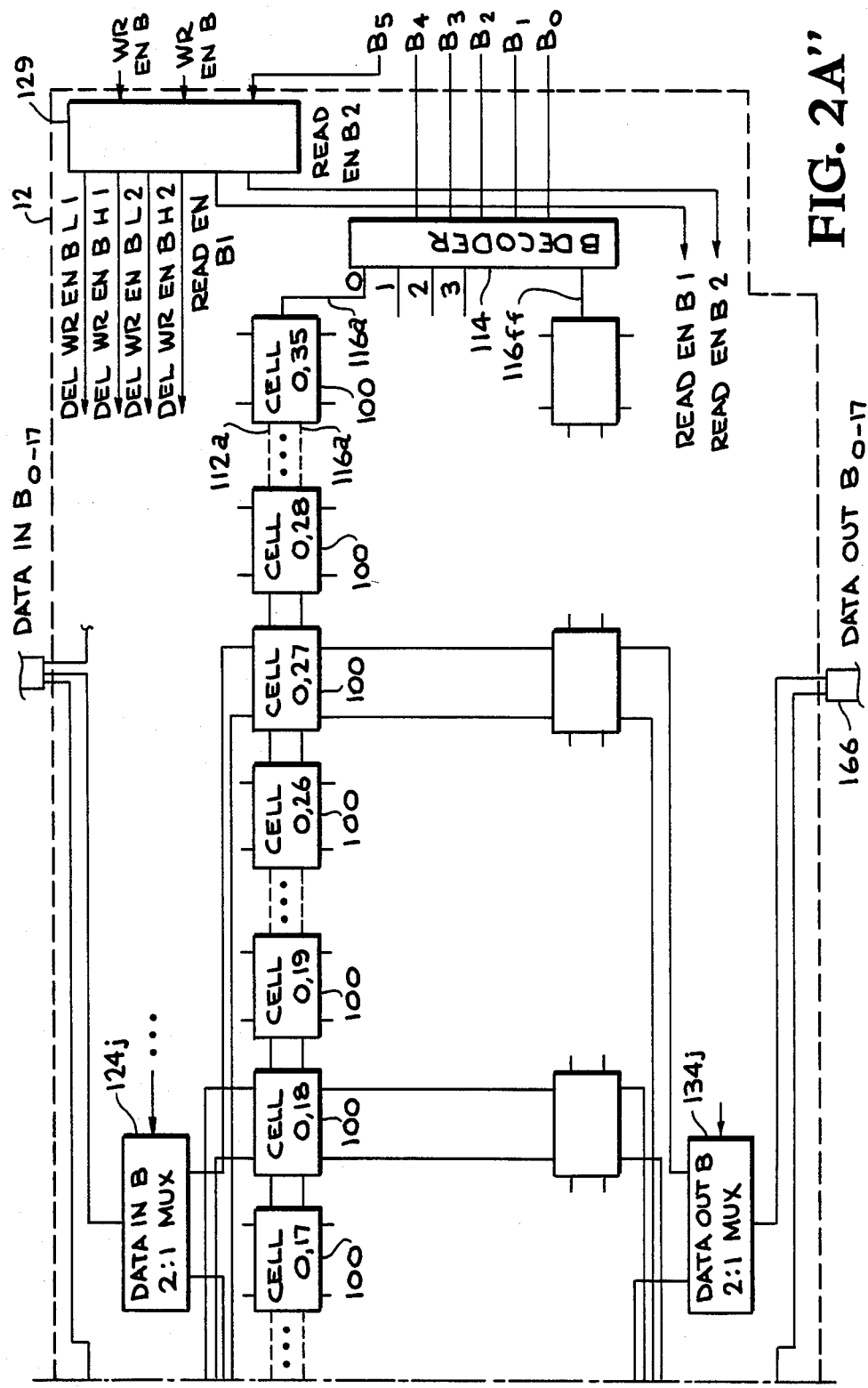

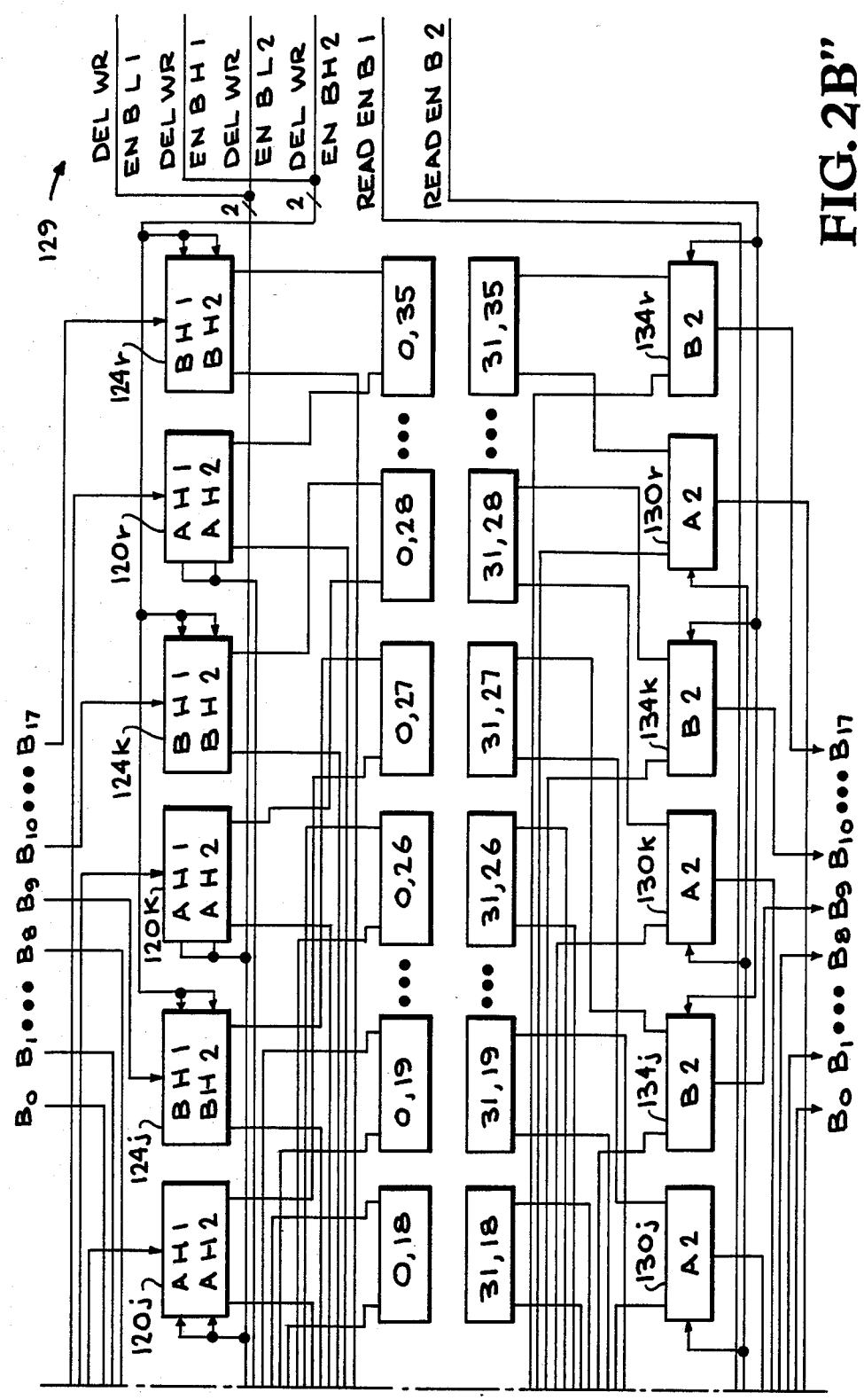
FIG. 2B"

DUAL-PORT READ/WRITE RAM WITH SINGLE ARRAY

CROSS REFERENCE TO RELATED APPLICATION

Related copending application of particular interest to this invention is application Ser. No. 659,390, filed Oct. 10, 1984, on behalf of Paul Chu and Ole Moller entitled "Expandable Four-Port Register File" and assigned to the assignee of the instant application.

This invention relates generally to storage elements used in programmable digital devices and, more particularly, to a single-array memory having novel storage cells permitting independent read/write access from an "A"-side and a "B"-side and useable in a two read-port, two write-port register file providing communication to all four ports.

BACKGROUND OF THE INVENTION

Many programmable digital devices, such as microprocessors, have a shared dual-access scratch-pad memory. For example, when two such microprocessors share a message buffer between them, each processor needs both a read and a write port.

Thus, so-called dual-access memories are commonly-employed in programmable digital devices. Presently, these memories are constructed from a number of separate integrated circuit chips which will typically include a pair of separate single-access memory chips with a multiplexer on a third chip connected to the input ports of the memories. Access to one or the other of the memories is controlled by a memory switching signal applied to the multiplexer.

The presence of an external multiplexer has a number of undesirable consequences: an overhead time penalty is added to all memory accesses and more complex timing control requirements are necessitated by the need to apply the memory switching signal sufficiently in advance of the access to allow stabilization of the signal paths passing through the multiplexer; in many instances a separate multiplexer switching clock was used.

Even if these undesirable consequences are considered manageable, a further difficulty with the use of two single-access memories and the inter-memory switching multiplexer is that this arrangement does not permit independent reading and writing, from both the input ports and the output ports, as may be needed in a particular application. Presently, another off-chip multiplexer is used to switch from read to write address. The use of an external read/write multiplexer entails further difficulties: additional timing signals were necessitated, usually supplied by a separate write clock which had a critical ten nanosecond timing window during which the address signal must stabilize in order to avoid race conditions. This was a major nuisance in the design of a working memory.

Further, since it is desirable to be able to access the data stored in any given location from either port, the data must be replicated in both single-access memories. In prior art memories of this construction, an additional clock phase is typically added to transfer data written into a given location in one of the single access memories to the other single-access memory, thereby imposing a significant time overhead in the cycle time of the memory.

The use of a number of separate chips to form the dual-access memory increases the cost of fabrication due to the large number of terminal pins which must be interconnected and decreases the access speed, over and above that already mentioned, due to inter-chip signal propagation delay.

Additionally, present dual-access memories use bi-directional busses to connect the individual storage locations to a single set of terminals used for both input and output. This technique is slow in that it requires a reversal of the bi-directional busses for each access cycle.

Finally, present memories support byte-oriented operations through the use of separate memories, one for each byte. This method involves duplication of much of the peripheral elements supporting the memories resulting in more expensive device with a greater number of pin interconnections.

In another application, a four read-port, two write port memory is to be shared by a two-input arith- metic-logic (ALU) and a two-input multiplier processor. In this case, two read ports are connected to the input of the ALU and the remaining two read ports are connected to the inputs of the multiplier. The ALU output is connected to one of the memory write ports and the multiplier output to the other write port of the memory. Thus, it is desirable to be able to expand in a parallel manner a dual-access memory so that arithmetic addition and subtraction by the ALU can be performed in parallels with multiplication and division by the multiplier.

SUMMARY OF THE INVENTION

The novel storage element of the present invention provides a true two read-port, two write-port register file, each port served with a dedicated unidirectional bus permitting simultaneous dual read/write access from both read- or write-ports. The invention is preferably embodied in a single integrated circuit chip as a single-array dual-access read/write random access memory (RAM) supported by on-chip peripheral elements. The four-port register file provided by the present invention is expandable to form a four read-port, two write-port register file, for example, as required to perform parallel address and data computation.

The register file permits dual read/write access through an "A"-side and a "B"-side and employs dual on-chip multiplexers to affect independent transitions from read to write on the "A"- and "B"-sides. The presence of these on-chip multiplexers improves access time and eliminates the need for a second separate write clock and removes the attendant timing criticality concerns. The related copending application Ser. No. 659,390, filed Oct. 10, 1984, on behalf of Paul Chu and Ole Moller entitled "Expandable Four-Port Register File" and assigned to the assignee of the instant invention is hereby incorporated by reference into the instant application and contains a complete description of the operation and the architecture of the elements of the register file external to the single-array dual-access RAM of the instant invention.

The novel single-array on-chip dual-access RAM, eliminates the need for a memory switching multiplexer on the write-ports because the RAM used in the present invention is of a novel single-array design employing novel storage cells all of which are in direct communication with all four ports. Hence data at either write-port can be written into any register within the RAM or read from any register via either read-port.

The RAM consists, in one embodiment of the invention, of 64 eighteen-bit registers, each having an individually-writable low- and high-order byte, and arranged into thirty-two rows of two registers each. Each bit of a register is stored in a novel storage cell which in accordance with the teaching of this present invention serves as a juncture point of a pair of unidirectional signal lines communicating a bit to be written into the cell of a selectable one of either an A-side or a B-side input data word, a pair of unidirectional signal lines communicating a bit to be read from the cell to a selectable one of either an A-side or a B-side output data word, and a pair of row-selection signal lines, one for A-side address selection and one for B-side address selection.

According to the teaching of the present invention, the storage cell employs a novel circuit arrangement in which read current is borrowed during the writing into a cell to change the state of the flip flop storage element.

A pair of on-chip A-side and B-side read/write enable circuits employ novel asymmetrical read/write-delay elements providing a write-delay to avoid overwriting the contents of storage cells at an address which is currently selected to be read from during the transition to a write at another address, yet providing no unnecessary and undesirable read delays during the write-to-read transition.

A pair of on-chip A-side and B-side address decoders employ a novel oscillation-damping capacitance which can be selectably applied to the base of the driver transistor supplying the row-selection signal to the selected row of storage cells at the A-side or B-side address to be written to or read from. Unlike prior art drivers which use discrete relatively large capacitors on each such driver transistor which utilize scarce on-chip space, the present invention employs a Schottky clamp diode at the base of each of the thirty-two selection driver transistors which cooperate in parallel to form an equivalent capacitance at the base of the selected driver transistor sufficient to damp oscillations of the selected driver transistor and assure that it remains in a completely conducting state adequate to sink the row-selection current of all thirty-six storage cells within the selected row.

The file register of the present invention thus permits byte-oriented operations by providing independent access of the upper 9 bits and the lower 9 bits of any register to be written individually.

The use of unidirectional busses and the two independent write-ports provided by the single-array dual-access RAM, permits two register files of the present invention to be operated in parallel to form a two write-port, four read-port register file.

DESCRIPTION OF AN ILLUSTRATIVE EMBODIMENT

The dual-port read/write random access memory (RAM) of the present invention comprises a single array of novel memory storage cells, each of which can be independently accessed from an "A"-side and a "B"-side for reading or writing. The total number of cells within the array, the number of cells allocated to each row and column of the array, the division of rows into a number of words, and the division of words into a number of bytes may vary from implementation to implementation while still providing the various benefits of the invention.

Figure 1:
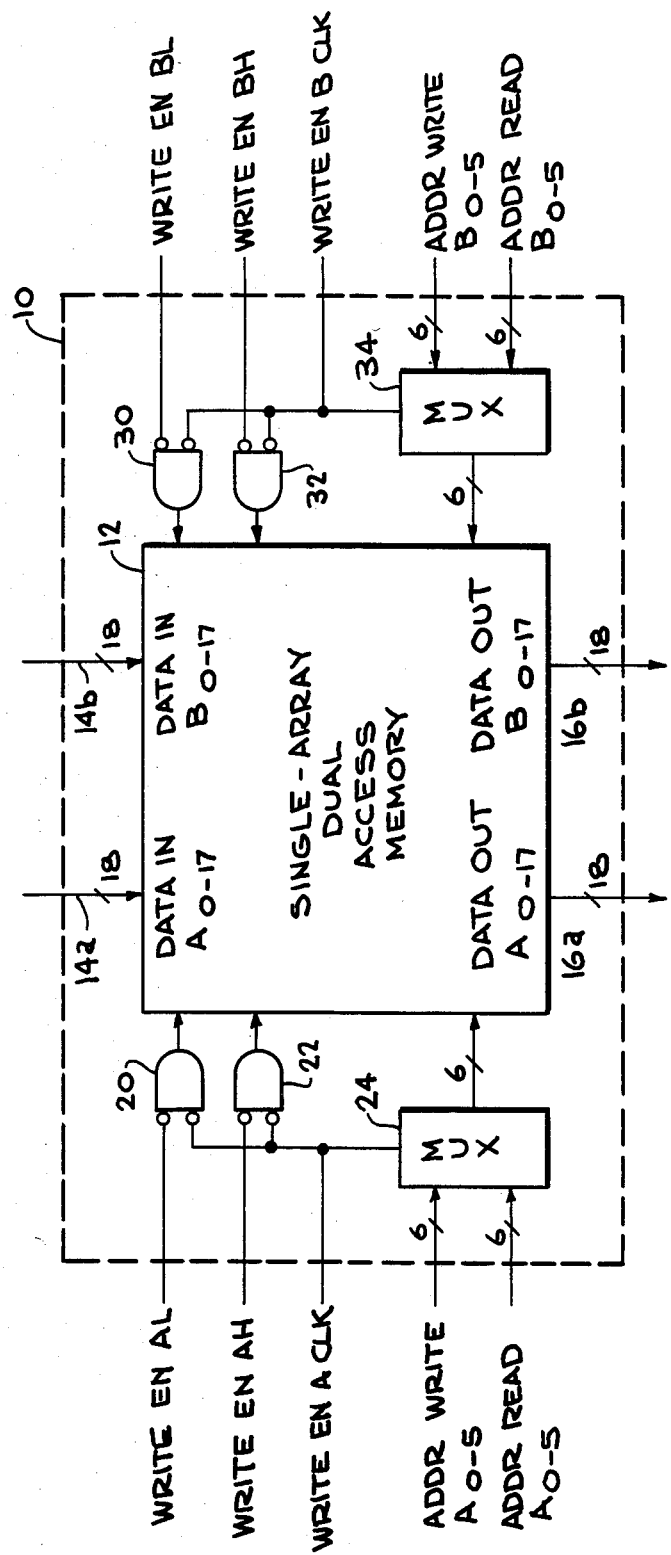
FIG. 1 is a block diagram of a two read-port, two write-port register file employing the dual-access random access memory of the present invention.

FIG. 1 illustrates a two read-port, two write-port register file 10 employing a single-array dual-access memory 12 constructed in accordance with the teachings of the present invention. It is realized as a single integrated circuit chip and, as illustrated, comprises a two read-port, two write-port, single-array, random access memory 12 having dual read/write access provided via an "A"-side, and a "B"-side, address control consisting of AND gates 20 and 22 and multiplexer (MUX) 24, and AND gates 30 and 32 and multiplexer (MUX) 34, respectively.

Memory 12 receives at a write port DATA_IN_A$_{0-17}$ an eighteen-bit data word conducted to the memory via a unidirectional data bus 14a and at a write port DATA_IN_B$_{0-17}$ an eighteen-bit data word conducted to the memory via a unidirectional data bus 14b. Memory 12 presents at pair of read ports DATA_OUT_A$_{0-17}$ and DATA_OUT_B$_{0-17}$, eighteen-bit data words which are conducted from the memory 12 via a pair of unidirectional data busses, 16a and 16b, respectively.

The "A"-side and "B"-side of memory 12 provide independent simultaneous, random access to any register within the memory. As the "A"-side and "B"-side address controls function identically, only the operation of the "A"-side address control will now be described. Memory 12 comprises a single array of 64 addressable registers, each register capable of storing an eighteenbit word consisting of a low-order byte comprising bits 0 through 8 and a high-order byte comprising bits 9 through 17. Either the low- or high-order byte of a register can be independently accessed during writing via an inverted write enable low byte (WRITE_EN_A_L) or write enable high byte (WRITE_EN_A_H) signal applied to an inverted input of the AND gate 20 or AND gate 22, respectively.

In a typical application, the four-port register file 10 would be used in a programmable digital device such as a microprocessor which employs a system clock to effect synchronous operation of the microprocessor. The signal generated by the clock is communicated to the register file 10 as an inverted write enable clock (WRITE_EN_A_CLK) signal and applied to an inverted input of AND gates 20 and 22, and to a non-inverted input of the MUX 24. The MUX 24 selects, under the control of the WRITE_EN_A_CLK input, the particular 6-bit write address (ADDR_WRITE_$A_{0-5}$) or read address (ADDR_READ_$A_{0-5}$) applied to the MUX 24 to effect either a write or a read, respectively, from the register of memory 12 at the specified address.

During the period when the WRITE_EN_A_CLK signal is a HIGH, the AND gates 20 and 22 conduct the WRITE_EN_A_L and WRITE_EN_A_H control signals, respectively, to the memory 12 and the MUX 24 conducts the 6-bit ADDR_WRITE_$A_{0-5}$ address to the memory 12. When the WRITE_EN_A_CLK signal is a LOW, the AND gates 20 and 22 are disabled and LOW write enable control signals are conducted to the memory 12 and the MUX 24 conducts the 6-bit ADDR_READ_$A_{0-5}$ signal to the memory 12.

The application of a HIGH write enable "A" control signal for either a low- or high-order byte of a register specified by a write "A" address applied to the memory 12 causes the low- and/or high-order byte of the data word at the DATA_IN_$A_{0-17}$ port to be destructively written to the specified byte(s) of the specific register within memory 12. Similarly, the application of a LOW write enable "A" control signal for either a low- or high-order byte inhibits writing of the low-or high-order byte at the DATA_IN_$A_{0-17}$ port to the corresponding byte of the specified register.

The WRITE_EN_A_CLK signal is a LOW, the eighteen-bit contents of the register specified by a read "A" address applied to the memory 12 is non-destructively read out and conducted to the DATA_OUT_$A_{0-17}$ port of the memory 12.

Since the register file 10 of the instant invention permits the independent application of clock signals at the "A"-side and "B"-side, a given register could be written into, from side "A" for instance, and read from, from side "B" for instance, simultaneously. In this case the value read is the value written. Alternatively, a given register could be written from both the "A" side and the "B" side at the same time. In this case the value written is undefined. Of course, a given register can be read from simultaneously with consistent resulting values.

A more complete description of the architecture of the file 10 external to the memory 12 is contained in related copending application Ser. No. 659,390, filed Oct. 10, 1984, on behalf of Paul Chu and Ole Moller entitled "Expandable Four-Port Register File" and assigned to the assignee of the instant application and is hereby incorporated by reference into the instant application.

The single-array dual-access memory 12 is preferably constructed from emitter-coupled logic (ECL) integrated circuitry and can be fabricated to be externally compatible either with transistor-transistor logic (TTL) or ECL. As illustrated in FIG. 1, memory 12 is configured to provide 64 words of storage with eighteen bits per word, each word consisting of a low-order byte comprising bits 0 through 8 and a high-order byte comprising bits 9 through 17.

Figure 2A:
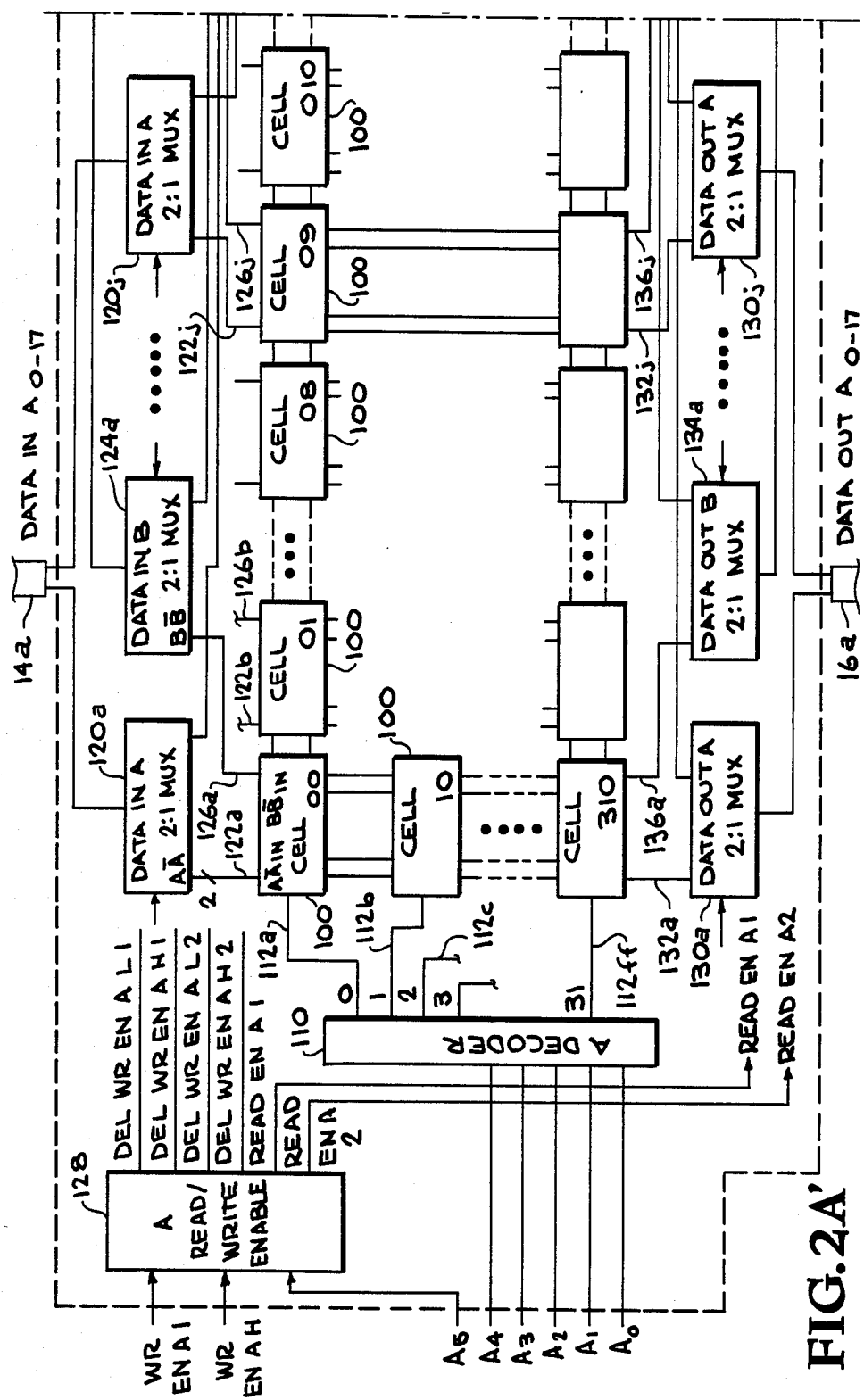
FIGS. 2A' and 2A" when arranged as shown in FIG. 2A comprise a block diagram of the dual-access memory of the present invention.

The 64×18 configuration is implemented by memory 12 of the instant invention as shown in block diagram form in FIG. 2A. As shown, memory 12 comprises a single array of 1152 storage cells, ($CELL_{x,y}$) 100 arranged in 32 rows, numbered 0 to 31, and 36 columns, numbered 0 to 35. A byte comprises nine adjacent cells within a row; consisting of columns 0 through 8, inclusive, 9 through 17, inclusive, 18 through 26, inclusive or 27 through 35. A word comprises two adjacent bytes within a row; consisting of columns 0 through 17 inclusive, or 18 through 35.

A conventional addressing scheme is employed to provide read access to either the "A"-side or "B"-side of each specified word, and write access to either the "A"-side or "B"-side of each byte of a specified word, within memory 12. Since the "A"-side and "B"-side address control functions identically, only the operation of the "A"-side address control will be described.

As shown in FIG. 2A, the high-order five bits $A_{0-4}$ of the 6-bit A-side address $A_{0-5}$, being either the 6-bit A-side write address (ADDR_WRITE_$A_{0-5}$) or the 6-bit A-side read address (ADDR_READ_$A_{0-5}$), as selected by MUX 24 of FIG. 1 is received by an A-address decoder (A_DECODER) circuit 110 which converts the address from its binary representation into one of a set of 32 signals corresponding to the storage cells 100 used for the storage of the word at the addresses having the highest-order five bits $A_0A_1A_2A_3A_4$. These "A"-side row selection signals are conducted to each storage cell 100 within the appropriate row of the array via one of a set of 32 signal lines 112a, 112b, ..., 112z, 112aa, 112bb, ..., 112ff. The selection of a row of the array by A_DECODER 110 causes the row current source current to be steered to the appropriate one of the 32 rows and the remaining 31 to remain "floating."

The memory 12 of the present invention includes eighteen A-bus data-in demultiplexers (DATA_IN_A_DEMUX) 120a, 120b, ..., 120r, each of which receives a corresponding one of the eighteen bits of the data word received at the DATA_IN_$A_{0-17}$ input to the register file 10, respectively. Each DATA_IN_A_DEMUX also receives a pair of A-side write enable signals to be described below, which causes the DATA_IN_A_DEMUX 120a, 120b, ..., 120r to conduct the eighteen bits of the word DATA_IN_$A_{0-17}$ to the storage cells 100 $CELL_{x,0}$, $CELL_{x,1}$, ..., $CELL_{x,17}$, respectively, comprising the lower-numbered addresses within the selected row x, $0 \leq x \leq 31$. A HIGH $A_5$ bit causes the demultiplexers to conduct the eighteen bits to the storage cells 100, $CELL_{x,18}$, $CELL_{x,19}$, ..., $CELL_{x,35}$, respectively, comprising the higher-numbered addresses within the selected row x, $0 \leq x \leq 31$. Each bit of the eighteen bits of the data word DATA_IN_$A_{0-17}$ is conducted to the set of 36 storage cells 100 CELL x,y comprising the $y^{th}$ column $0 \leq y \leq 35$ from the corresponding DATA_IN_A_DEMUX demultiplexer 120y. For each column, y, both the true and complemented value of the data word bit DATA_IN_A $_y$ and $\overline{DATA\_IN\_A_y}$, respectively, is conducted to each cell within the $y^{th}$ column of the array via a corresponding one of a set of 2-conductor unidirectional input signal lines 122a, 122b, ..., 122r. (A B-side address decoder (B_DECODER) circuit 114, a set of 32 B-side row selectional lines 116a, ..., 116ff and a set of eighteen B-bus data-in demultiplexers (DATA_IN_B_DEMUX_124a, 124b, ..., 124r perform the identical selection function for the word received at the DATA_IN_$B_{0-17}$ input based on a pair of B-side write enable signals. A set of 2-conductor unidirectional input signal lines 126a, 126b, ..., 126r conduct the true and complemented values to the corresponding storage cells 100.)

In addition, during a write operation, a low- and/or high-order 9-bit byte within the addressed word may be specified and the AND gate 20 and/or the AND gate 22, respectively, of FIG. 1 will conduct a HIGH write-enable-A-low-byte (WR_EN_A_L) signal, a HIGH write-enable-A-high-byte (WR_EN_A_H) signal, respectively. These signals, along with the lowest order address bit A5, are received by a A-side read/write enable circuit 128 which, as shown in greater detail in FIG. 2B, generates asymmetrical delayed-write-enable A low byte 1 and 2 (DEL_WR_EN_A_L_1), (DEL_WR_EN_A_L$_{13}$ 2) signals which are conducted to the set of nine DATA_IN_A_DEMUX 120a, ..., 120i, delayed-write-enable A high byte 1 and 2 (DEL_WR_EN_A_H_1), (DEL_WR_EN_A_H_2) signals which are conducted to the set of nine DATA_IN_A_DEMUX 120j, ..., 120r, and read enable A word 1 and 2 (READ_EN_A_1), (READ_EN_A_2) signals which are conducted to a set of eighteen A-side data-out multiplexers. These signals affect selection of the storage cells 100 containing the word at the A-side address specified by A$_{0-5}$, in accordance with Table I, below.

(A B-side read/write enable circuit 129 similarly receives the write-enable-B-low byte (WR_EN_B_L) signal generated by the AND gate 30 and the write-enable-B-high byte (WR_EN_B_L) signal generated by the AND gate 32 and generates asymmetrical delayed-write-enable-B-low-byte 1 and 2 (DEL_WR_EN_B_L_1) (DEL_WR_EN_B_L_2) signals which are conducted to the set of nine DATA_IN_B_DEMUX 130a, ..., 130i, delayed-write-enable-B-high-byte 1 and 2 (DEL_WR_EN_B_H_1) (DEL_WR_EN_B_H_2) signals which are conducted to the set of nine DATA_IN_B_DEMUX 130j, ..., 130r, and read enable B word 1 and 2 (READ_EN_$_B$_1) (READ_EN_B_2) signals which are conducted to a set of eighteen B-side data-out multiplexers.)

Figure 2B:
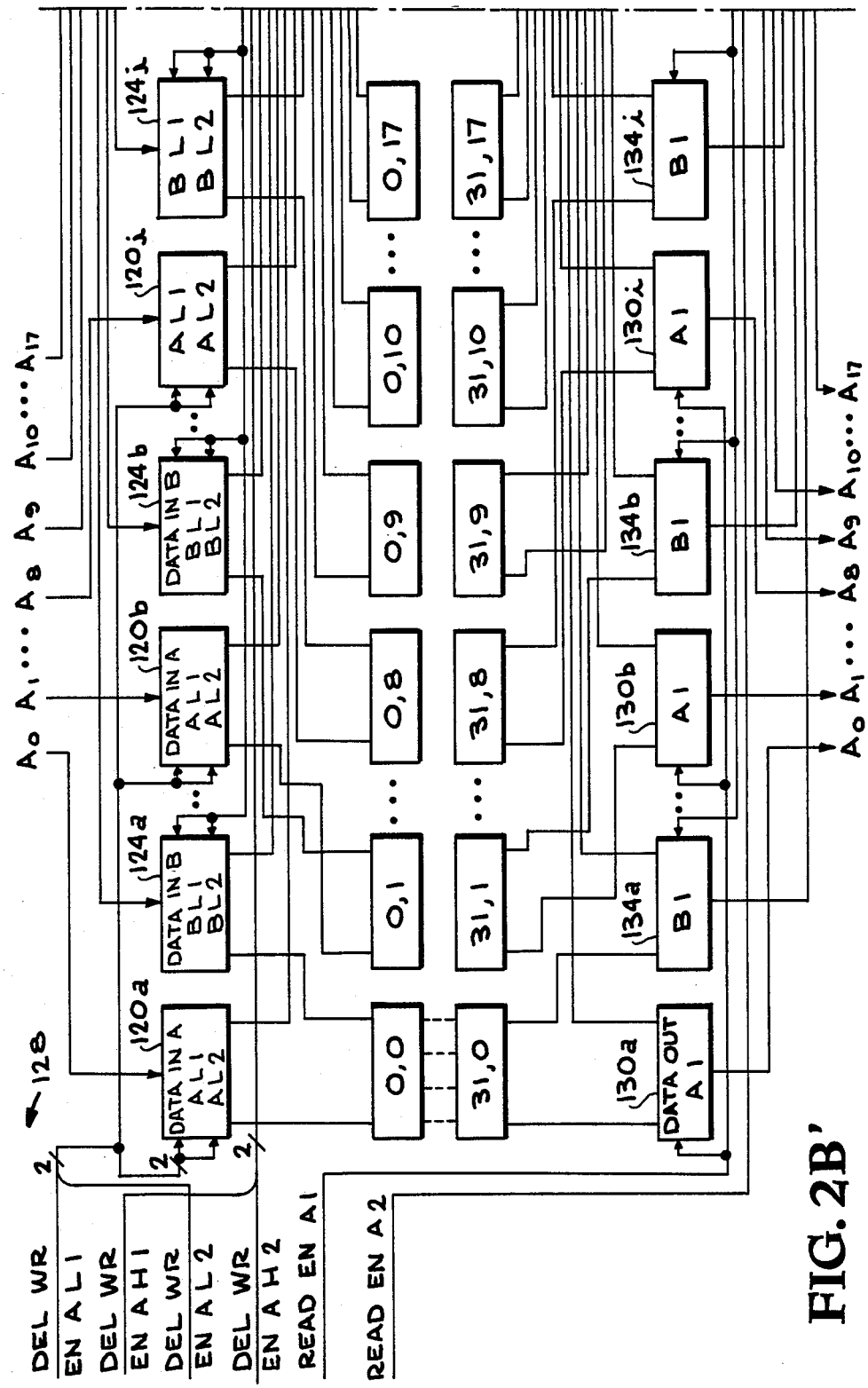
FIGS. 2B' and 2B" when arranged as shown in FIG. 2B illustrate the detailed interconnection of the A-side and B-side read/write enable circuits to the data-in, and data-out multiplexers.

As shown in detail in FIG. 2B, a set eighteen A-bus data-out multiplexers (DATA_OUT_A_MUX) 130a, 130b, ..., 130r, eighteen corresponding 2-conductor unidirectional output signal lines 132a, 132b, ..., 132r and eighteen B-bus data-out multiplexers (DATA_OUT_B_MUX) 134a, 134b, ..., 134r, and eighteen corresponding 2-conductor unidirectional output signal 136a, 136b, ..., 136r connect each column within the array of memory 12 to the DATA_OUT_A$_{0-17}$ and DATA_OUT_B$_{0-17}$ outputs, respectively, of the register file 10. The low-order DATA_OUT_A_MUX 130a, ..., 130i and the low-order DATA_OUT_B_MUX 134a, ..., 134i receive the READ_EN_A_1, respectively, the READ_EN_B_1, low-order read enable signals generated by the A-side read/write enable circuit 128, respectively, the B-side read/write enable circuit 129, and the high-order DATA_OUT_A_MUX 130j, ... 130r and the high-order DATA_OUT_B_MUX 134j, ..., 134r receive the READ_EN_A_2, respectively, the READ_EN_B_2, high-order signals generated by circuits 128, respectively, 129, and select the storage cells 100 corresponding to the low- or high-numbered address within a specified row of the array in exactly the same manner as do the input demultiplexers, as described above.

With reference to FIGS. 1 and 2, it will be appreciated that each memory storage cell 100 within single-array dual-access memory 12 must serve as the juncture of at least ten signal lines; the four unidirectional lines leading from the y$^{th}$ bit position of the DATA_IN_A$_y$ and $\overline{DATA\_IN\_A_y}$ and DATA_IN_B$_y$ and $\overline{DATA\_IN\_B_y}$ write ports to the storage cell, the four unidirectional lines leading from the cell to the DATA_OUT_A$_y$ and DATA_OUT_B$_y$ read ports, the "A"-side row-selection line, and the "B"-side row-selection line.

Figure 3:
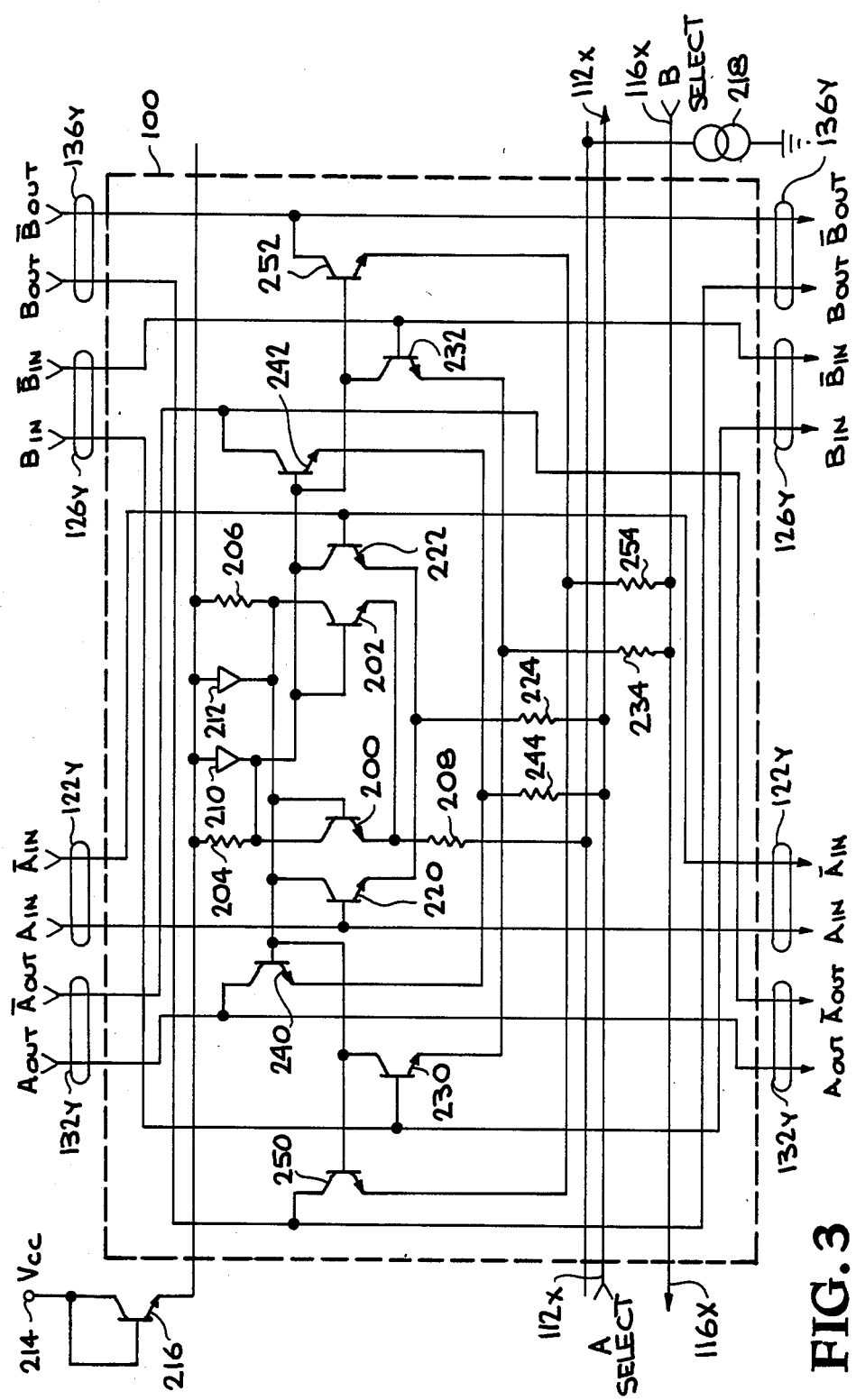
FIG. 3 is a schematic diagram of the storage cell of the present invention.

The novel storage cell of the instant invention, illustrated in FIG. 3, provides the requisite junctioning

TABLE I

Storage Cell A-Side Selection by Read/Write Enable Circuit 128

| | INPUTS | | OUTPUTS | | | | | |
|---|---|---|---|---|---|---|---|---|
| | LOW/HIGH BYTE SIGNAL FROM | | DEL_WR_EN_A_ | | | | READ_EN_A_ | |
| LOW-ORDER ADDRESS BIT A5 | AND 20 | AND 22 | L 1 | H 1 | L 2 | H 2 | 1 | 2 |
| L | L | L | L | L | L | L | L | H |
| L | L | H | L | L | L | H | L | L |
| L | H | L | L | L | H | L | L | L |
| L | H | H | L | L | H | H | L | L |
| H | L | L | L | L | L | L | H | L |
| H | L | H | L | H | L | L | L | L |
| H | H | L | H | L | L | L | L | L |
| H | H | H | H | H | L | L | L | L |

The A-side read/write enable circuit 128 and the B-side read/write enable circuit 129 employ write delay circuitry which generates asymmetrical read enable and write enable signals which are conducted to a set of thirty-six data-out demultiplexers and to the set of thirty-six data-in multiplexers, respectively. The write delay circuitry provides write delays during the deselection of a read address and the selection of a write address but no delay during the deselection of a write address and the selection of a write address so as to avoid overwriting the contents of the storage cells 100 during the transition from read to write, as will be described hereinafter.

capability necessitated by the dual-access read/write unidirectional bus features of the instant invention. As shown, each storage cell 100 in a given row, x, and column, y, receives the DATA_IN_A$_y$ and $\overline{DATA\_IN\_A_y}$ bits via the 2-conductor signal line 122y from the DATA_IN_A_DEMUX 120y conducting the corresponding bit of the 18-bit data word at the "A"-side write port of the memory 12 and the $\overline{DATA\_IN\_B_y}$ and DATA_IN_B$_y$ bits via the 2-conductor signal line 126y from the DATA_IN_B_DEMUX 124y conducting the corresponding bit of the 18-bit data word at the "B"-side write port of the memory 12. In addition, each such storage cell 100 supplies the DATA_OUT_A$_y$ and $\overline{\text{DATA\_OUT\_A}_y}$, and DATA_OUT_B$_y$ and $\overline{\text{DATA\_OUT\_B}_y}$ bits to the DATA_OUT_A_MUX 130$y$ and the DATA_OUT_B_MUX 134$y$ leading to the "A"- and "B"-side read ports of the memory 12, via 2-conductor signal lines 132$y$ and 136$y$, respectively.

The "A"-side and "B"-side row-selection signal lines 112$x$ and 116$x$, respectively, shown in FIG. 3 are the signal lines leading from the A_DECODER 110 and B_DECORDER 114, respectively, and are the resulting signals generated by the "A"-side and "B"-side address-selection circuitry 24 and 110 and 34 and 114, respectively as described in reference to FIGS. 1 and 2, above.

With reference to FIG. 3, NPN transistors 200 and 202, associated resistors 204, 206 and 208, and clamp diodes 210 and 212 form a flip-flop comprising the storage element of cell 100. A voltage source, V$_{cc}$, 214, supplies current through a level-shifting transistor 216 to the collector of transistor 200 via the parallel combination of resistor 204 and diode 210 and to the collector of transistor 202 via the parallel combination of resistor 206 and diode 212. The bases of transistors 200 and 202 are tied to the collectors of the transistor 202 and 200, respectively, in the conventional flip-flop configuration. Current from the emitter of the flip-flop transistor 200 or 202, whichever is "ON", i.e. in the conducting state is conducted via resistor 208 leading from the common connection of both emitters to ground via a constant current source 218, in series with resistor 208. Voltage source 214, level-shifting transistor 216 and current source 218 are external to storage cell 100 and, in fact, supply voltage and current to all 36 storage cells within the row x of the array of cells within memory 12.

The signal representing DATA_IN_A$_y$ is conducted on the true signal line of the 2-conductor unidirectional signal line 122$y$ to the base of an NPN transistor 220 and the complemented signal $\overline{\text{DATA\_IN\_A}_y}$ is conducted on the complemented signal line of the line 122$y$ to the base of an NPN transistor 222. Transistors 220 and 222, along with a write resistor 224 and the aforementioned resistors 204 and 206 and clamp diodes 210 and 212, form an "A"-side writing circuit. The voltage source, V$_{cc}$, 214 supplies current through level-shifting transistor 216 to the collector of transistor 220 via the parallel connection of resistor 206 and diode 212 and to the collector of transistor 222 via the parallel combination of resistor 206 and diode 212. The emitters of transistors 220 and 222 are joined in a common connection which leads to the A-row current source via the resistor 224 and the A-row selection signal line 112$x$, to which write resistor 224 is connected.

(A "B"-side writing circuit is formed from NPN transistors 230 and 232 connected at this bases to the true and complemented signal lines, respectively, of the 2-conductor unidirectional signal line 126$y$ conducting the signal representing DATA_IN_B$_y$. Transistors 230 and 232 along with a write resistor 234, connected to B-row selection signal line 116$x$ and the aforementioned resistors 204 and 206 and diodes 210 and 212 constitute the "B"-side writing circuit.)

An "A"-side reading circuit is formed from a pair of NPN transistors 240 and 242 connected at their collectors to the true and complemented signal lines, respectively, of the 2-conductor unidirectional signal line 132$y$ conducting the signal representing DATA_OUT_A$_y$. The bases of transistors 240 and 242 are connected to the voltage source 214 via resistor 206 and diode 212, and resistor 204 and diode 210, respectively. The emitters of transistors 240 and 242 are joined in a common connection with a read resistor 244. The other lead of read resistor 244 is connected to the A-row selection signal line 112$x$.

(A "B"-side reading circuit is formed from NPN transistors 250 and 252 connected at their collectors to the true and complemented signal lines, respectively, of the 2-conductor unidirectional signal line 136$y$ conducting the signal representing DATA_OUT_B$_y$. Transistors 250 and 252, along with a read resistor 254 connected to the B-row selection signal line 116$x$ and the above-mentioned resistors 204 and 206 and diodes 210 and 212 constitute the "B"-side reading circuit.)

The contents of the dual-access read/write storage cell 100 can be nondestructively read or destructively written from the "A"-side, for example, by addressing from the "A"-side the appropriate row within the single array of memory 12, as described above, in connection with A_DECODER 110, this will cause the appropriate "A"-side row selection current on signal line 112$x$ to be steered to the appropriate one of the 32 rows, as described above. Each storage cell 100 within the particular row selected is therefore activated, since signal line 112$x$ is connected to each of the "A"-side reading circuits within each storage cell 100 comprising transistors 240 and 242, via read resistor 244 and each of the "A"-side writing circuits within each storage cell 100 comprising transistors 220 and 222, via resistor 224.

The contents of each storage cell 100 within the selected row is determined by the state of the storage element flip-flop comprising transistors 200 and 202 and associated circuitry. Each such storage element flip-flop within each of the 36 storage cells 100 of the selected row is supplied with voltage V$_{cc}$ via source 214, level-shifting transistor 216, resistor 208 and current source 218.

To non-destructively read from a selected set of storage cells, 100, when the "A"-side row select line 112$x$ is selected each of the 36 A-side read storage cells 100, of the selected row only, will receive a one-thirty-sixth of the current flowing from a source through read resistor 244. Depending on the current state of storage element flip-flop within each storage cell 100, each individual selected storage cell 100 current will flow through either transistor 240 or transistor 242. This current is conducted on the true or complemented signal line respectively of the line 132$y$, where it is received at the "A"-side read port on signal line 16$a$ as a signal representing the bits of the data word comprising DATA_OUT_A$_{0-17}$.

The sensing of the contents of the storage element flip-flop within each storage cell 100 proceeds as follows: suppose, for example, transistor 200 is conducting, reflecting that the contents of this cell is in a HIGH state, and transistor 202 is non-conducting. Since transistor 200 is conducting, its base is at a voltage relatively higher than that of transistor 202. Since the bases of transistors 240 and 242 are connected in parallel with the bases of transistors 200 and 202, respectively, transistor 240 is in a conducting state and transistor 242 is in a non-conducting state. Hence, current will flow on the true signal line of line 132$y$ and will not flow on the complemented signal line of line 132$y$. The resulting current flows are conducted via 2-conductor signal line 132$y$ to the DATA_OUT_A_MUX 130$y$ where they are sensed and a binary-valued signal generated which represents the corresponding bit in the data word comprising DATA_OUT_$A_{0-17}$, according to conventional circuitry well-known to those skilled in the art.

To destructively write to a selected set of storage cells 100, when the "A"-side row select line 112x is steered to a current source at ground, as described, each of the 36 "A"-side read/write circuits of the storage cells 100, of the selected row only, conducts a one-thirty-sixth of the total current flowing along row select line 112x. The source will be one of the eighteen DATA_IN_A_DEMUX 120y receiving one bit of the data word comprising DATA_IN_$A_{0-17}$ and connected to the storage cell via 2-conductor signal line 122y. The demultiplexer will sense the bit and generate a binary-valued signal on the true and complement lines on the signal line 122y according to conventional circuitry well-known to those skilled in the art.

In addition, the low-and/or high-order byte of the 18-bit data word comprising either the nine low-order bits DATA_IN_$A_{0-8}$ and/or the nine high-order bits DATA_IN_$A_{9-17}$ can be selected to be destructively written to a selected set of nine low-order and/or nine high-order storage cells 100, within a selected row as specified by the WR_EN_A_L and/or WR_EN_A_H *signals received at the A-side read/write enable circuit 128, as described in connection with Table I, above. In this case, only the nine DATA_IN_A_DEMUX 120a, . . . , 120i receiving the* nine low-order bits DATA_IN_$a_{0-8}$ and/or nine DATA_IN_A_DEMUX 120j, . . . , 120r receiving the nine high-order bits DATA_IN_$A_{9-17}$ will receive the delayed write enable signal DEL_WR_EN_A_L_1 and/or DEL_WR_EN_A_H_1, or DEL_WR_EN_A_L_2 and/or DEL_WR_EN_A_H_2, in accordance with the low-order "A"-side address bit $A_5$ and the low and/or high byte signals generated by AND gate 20 and AND gate 22, respectively, in accordance with Table I, above.

Within each storage cell 100 of the selected row, the conducted current will divide between read resistor 244 and the write resistor 224 (so-called "current borrowing"); the ratio of the current division being in the ratio of the resistance of the read resistor 244 to the resistance of the write resistor 224. During writing, within each such storage cell 100, one and only one of the bases of the A-side write transistors 220 and 222 is brought to a voltage corresponding to a HIGH, by the write demultiplexer source, as described. Hence, either the base of transistor 220 or the base of transistor 222 will be brought to a higher voltage than the other base and the storage cell current will divide between the read resistor 244 and the write resistor 224. The resulting current flow through the write resistor 224 forces the appropriate base of either transistor 200 or transistor 202 to a relatively lower voltage. Due to the usual feedback connection of flip-flop transistors 200 and 202, the additional current flowing through the resistor 204 or 206 will cause one of the transistors to conduct and the other transistor to not conduct. The storage element flip-flop of cell 100 is thereby destructively written.

Again, suppose it is desired to write from the "A"-side into a selected storage cell 100 a HIGH signal. Accordingly, the true signal line of line 122y connected to the base of transistor 220 will be at a voltage relatively higher than that of the complemented signal line of line 122y connected to the base of transistor 222. When the base of transistor 220 is at a relatively higher-voltage than the base of transistor 222, current is "borrowed" from resistor 244. The "borrowed" current flows through the write resistor 224 connected to the emitters of transistors 220 and 222.

As a result of the current "borrowed" from the resistor 244, the base of transistor 200 will be at a relatively lower voltage than the base of transistor 202. Hence, flip-flop transistor 200 will begin to conduct relatively less current than transistor 202, and due to the usual feedback connection of flip-flop transistors 200 and 202, will result in transistor 202 becoming conducting and transistor 200 becoming non-conducting. The storage element flip-flop of cell 100 is thereby destructively written HIGH.

A LOW can be destructively written to a cell 100 by the presence of a relatively higher voltage on the complemented signal line of line 122y than on the true signal line of line 122y. Finally, if the storage element flip-flop of a cell 100 is presently storing a HIGH, for example, the destructive writing of a HIGH will proceed as described above: since transistor 202 is then presently conducting, and transistor 200 is nonconducting when transistor 220 "borrows" current flowing through the collector of the read transistor 240 or 242, the "borrowed" current will reduce the base voltage of transistor 200, but since transistor 200 is already off the flip-flop remains in the same state.

Non-destructive reading and destructive writing from the "B"-side of the dual-access read/write storage cell 100 of the present invention proceeds as described above for "A"-side read and write, in all respects, except that the "B"-side row current source is steered to a selected one of the 32 "B"-side row selection signal lines 116x and serves to conduct a one-thirty-sixth of the current flowing from a source through resistor 254 or resistor 234, depending on whether a "B"-side read or write is to be performed, respectively.

An "A"-side read or write can be performed independently and even simultaneously with a "B"-side read or write to storage cells 100 as independently selected by "A"-side and "B"-side addresses. However, simultaneous A-side and B-side writing to the same address will result in an undetermined value being written to that address.

In order to avoid overwriting the contents of the storage cells 100 at an address which is currently selected to read during the transition from a read at the given address to a write at another address, the dual-port read/write RAM 12 of the present invention employs a novel asymmetric internal delay circuit which provides write delays but no delays while reading, since reading is non-destructive and in order to not incur any unnecessary time-penalty, no delay is necessary nor desirable during reading.

Figure 4A:
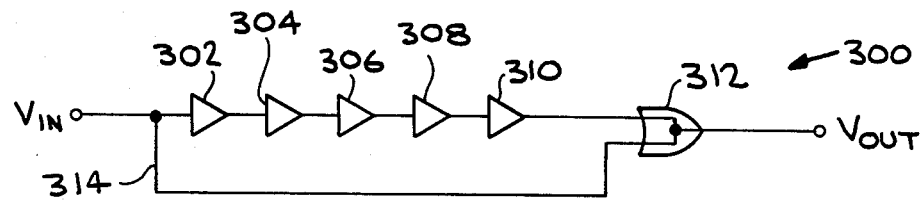
FIG. 4A is a logic diagram of the asymmetrical delay circuit of the present invention.

FIG. 4a illustrates the asymmetrical delay circuit 300 providing write delays during the deselection of a read address and the selection of a write address but no delay during the deselection of a write address and the selection of a read address. The write delay circuit 300 is preferably included in the "A"- and "B"-side read/write enable circuits 128 and 129 and deployed between the signal lines supplying the "A"- and "B"-side write enable signals WR_EN_A_L, WR_EN_A_H, WR_EN_B_L, WR_EN_B_H to the read/write enable circuits 128 and 129, and each of the thirty-six DATA_IN_A_DEMUX 120a, . . . , 120r, DATA_IN_B_DEMUX 124a, . . . , 124r, and each of the thirty-six DATA_OUT_A_MUX 130a, . . . , 130r, DATA_OUT_B_MUX 134a, . . . , 134r, as shown in FIGS. 2A and 2B.

With reference to FIG. 4A, the asymmetrical delay circuit 300 includes a set of five unit-delay elements of 302, 304, 306, 308 and 310 providing a five-time unit write-delay path between the input of the circuit and a first input of a wired-"OR" gate 312. A no read-delay path 314 connects the input of circuit 300 to a second input of the wired-"OR" gate 312. The output of the wired-"OR" gate 312 serves as the output of the asymmetrical delay circuit 300.

The operation of the asymmetrical delay circuit 300 is best explained by reference to FIG. 4B which illustrates a pair of voltage wave forms showing the voltage input ($V_{in}$) applied to circuit 300 and the resulting voltage output ($V_{out}$) from circuit 300 versus time (t).

Figure 4B:
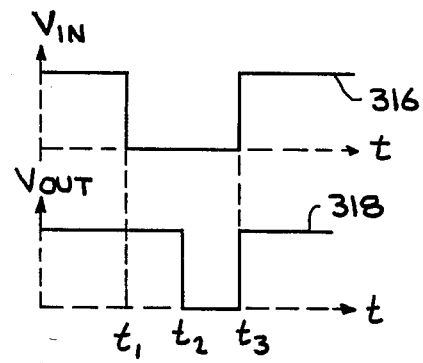
FIG. 4B is an illustration of the voltage waveforms generated by the asymmetrical delay circuit of the present invention.

As shown in the upper waveform of FIG. 4B, 316 at some time, $t_1$, the input voltage applied to the asymmetrical read/write delay circuit 300 changes from a HIGH voltage level to a LOW level representing a write request. The output of the circuit 300 has been held in the HIGH level prior to this time $t_1$ by the HIGH level on the no-read delay path 314 as applied directly to the second input of the wired "OR" gate 312. The second input of wired "OR" gate 312 drops to a LOW voltage at time $t_1$, but as the output at each of the unit-delay elements 302, 304, 306, 308 and 310 remains at a HIGH voltage level for one additional time unit, the output of element 310 does not reach a LOW voltage until five time units following $t_1$, $t_2$, i.e., $t_2 = t_1 + (5$ time units$)$. Accordingly, the first input of the wired "OR" gate 312 remains at a HIGH voltage level until time $t_2$ at which time it drops to a LOW voltage level and the output of the wired OR gate 312, and hence the voltage output of circuit 300, will drop to a LOW voltage level at time $t_2$, as shown in the lower waveform 318 of FIG. 4B.

When a subsequent read request is received by the read/write delay circuit 120 or 129, at some time $t_3$, the input voltage applied to the asymmetrical read/write delay circuit 300 changes from a LOW voltage level to a HIGH level, as shown in the upper waveform 316 of FIG. 4B. Assuming the internal delay between the preceding write request was received at time $t_1$, and the read request received at $t_3$, exceeds five unit delay times, the voltage at the first input of the wired "OR" gate 312 will be a LOW at time $t_3$, and the second input will be at a LOW voltage level just prior to $t_3$ and the output of the wired "OR" gate 312, and hence the voltage output of circuit 300, will therefore rise from a LOW to a HIGH voltage level at time $t_3$, as shown in the lower waveform 318 of FIG. 4B.

Figure 4C:
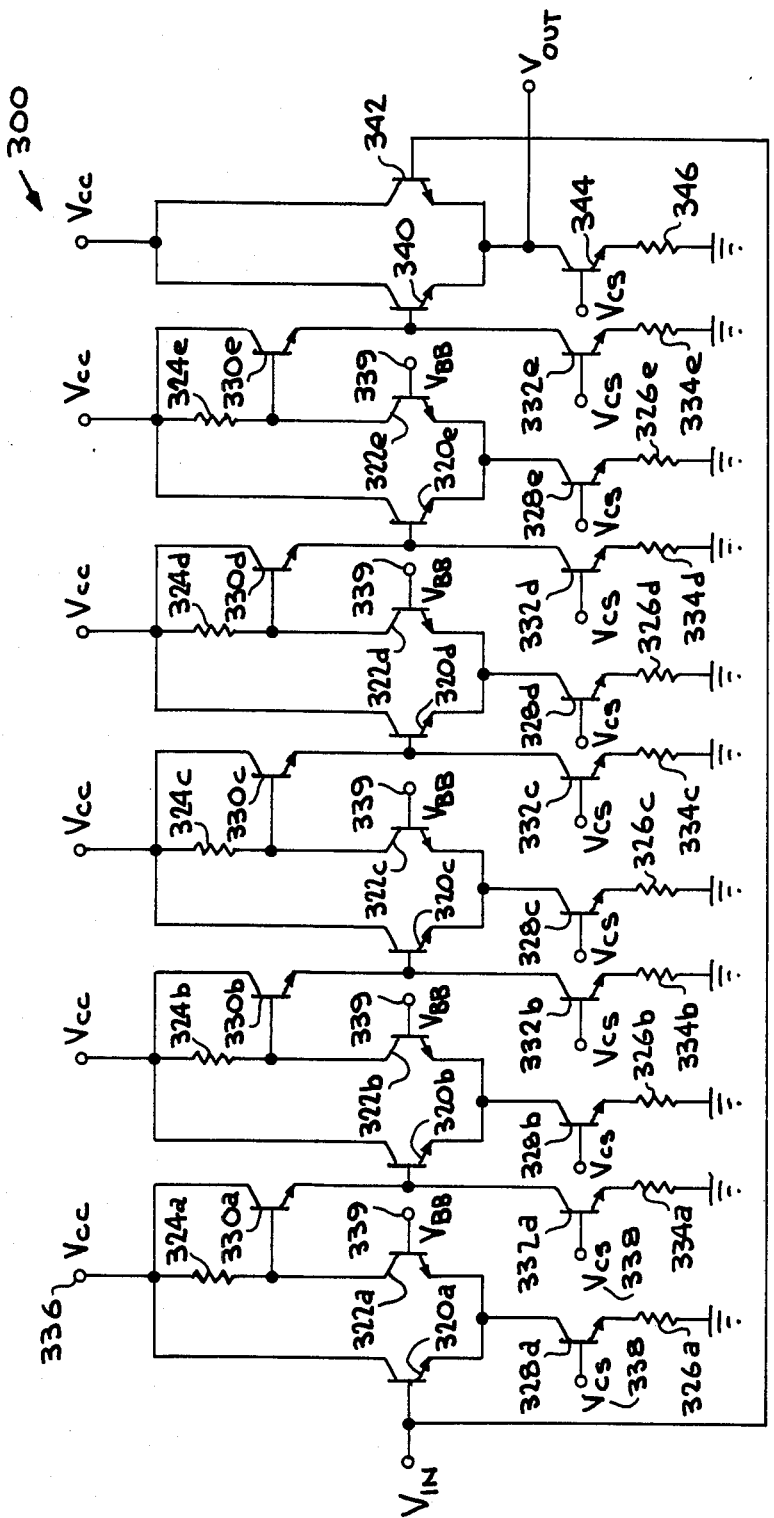
FIG. 4C is a schematic diagram of the asymmetrical delay circuit of the present invention.

Accordingly, the asymmetrical read/write delay circuit 300 of FIG. 4A provides the five-unit delay for write enables but no delay for read enables, as described above in connection with FIG. 4B. FIG. 4C is a schematic diagram of the asymmetrical read/write delay circuit 300 of the present invention. With reference to FIG. 4C, NPN transistors 320a and 322a, associated resistors 324a and 326a and NPN transistor 328a, and NPN transistors 330a and 332a and resistor 334a form one delay stage, corresponding to the unit delay element 302 of the block diagram FIG. 4A. The remaining four delay stages corresponding to the unit delay elements 304, 306, 308 and 310 of FIG. 4A are formed from identical NPN transistors and associated resistors denoted in FIG. 4C by a like numeral 320 through 334 followed with the alphabetical suffix "b", "c", "d" and "e", respectively, for each of the four remaining stages. A voltage source, $V_{cc}$, 336a, supplies voltage to the collector of transistor 320a and through resistor 324a to the collector of transistor 322a. The emitters of transistors 320a and 322a are connected together and to the collector of transistor 328a which has its emitter connected to ground via a resistor 326a and completes the circuit supplying the non-inverting delay portion of the first stage comprising transistors 320a, 322a, and 328a and resistors 324a and 326a. A standard ECL output portion comprising transistors 330a and 332a and resistor 334a is connected to the collector of transistor 322a via the base of transistor 330a whose collector is connected to voltage source $V_{cc}$ 336a and whose emitter is connected to the collector of transistor 332a. The emitter of transistor 332a is connected to ground via resistor 334a.

The bases of transistors 328a and 332a are connected to a voltage source, $V_{cs}$, 338, and the base of transistor 322a is connected to a bias voltage source, $V_{BB}$, 339.

In the case of the first delay stage, the base of transistor 320a is connected to the terminal of the asymmetric read/write delay circuit 300 receiving the input voltage ($V_{in}$). In the case of the four remaining delay stages, the base of transistor 320b, 320c, 320d, or 320e is connected to the standard ECL output of the preceding stage, i.e. the junction of the emitter of transistor 330a, 330b, 330c, or 330d, and the collector of transistor 332a, 332b, 332c, or 332d, respectively.

The non-inverting delay portion of each stage, comprising transistors 320a, 322a and 328a and resistors 324a and 326a, in the case of th-e first delay stage, form an emitter-coupled logic (ECL) buffer which provides the requisite one time unit delay, as is well-known to those skilled in the art.

The standard ECL output from the fifth delay stage, i.e. the junction of the emitter of transistor 330e and the collector of transistor 332e, is connected to the base of an NPN transistor 340 serving as the first input to a wired "OR gate. The collector and emitter of transistor 340 are connected in parallel to the collector and emitter, respectively, of an NPN transistor 342. Their collectors are connected to the voltage source $V_{cc}$, 336, and their emitters are connected to the collector of an NPN transistor 344 which has its emitter connected to ground via a resistor 346 and completes the circuit supplying voltage $V_{cc}$ to the ECL circuit corresponding to the wired "OR" gate 312. The output voltage ($V_{out}$) generated by the asymmetric read/write delay circuit 300 is that present at the collector of transistor 344. The base of transistor 344 is connected to the voltage source $V_{cs}$, 338. The base of transistor 342 is connected to the terminal of circuit 300 receiving the input voltage($V_{in}$) and serves as the second input to the wired "OR" gate comprising transistors 340, 342 and 344 and resistor 346.

In order to avoid oscillation of the row-selection signals generated by the address decoders A_DECODER 110 and B_DECODER 114, the dual-port read/write RAM 12 of the present invention employs arrangement of thirty-two Schottky diode capacitance stabilizers within each address decoder 110 and 114. These Schottky diodes provide a selectable capacitance alternative to the space-consuming provision in the prior art of an actual relatively large on-chip capacitor on each row signal line. Since only the selected row needs to be stabilized against oscillation the novel diode capacitance of the instant invention affects only the selected line.

Figure 5:
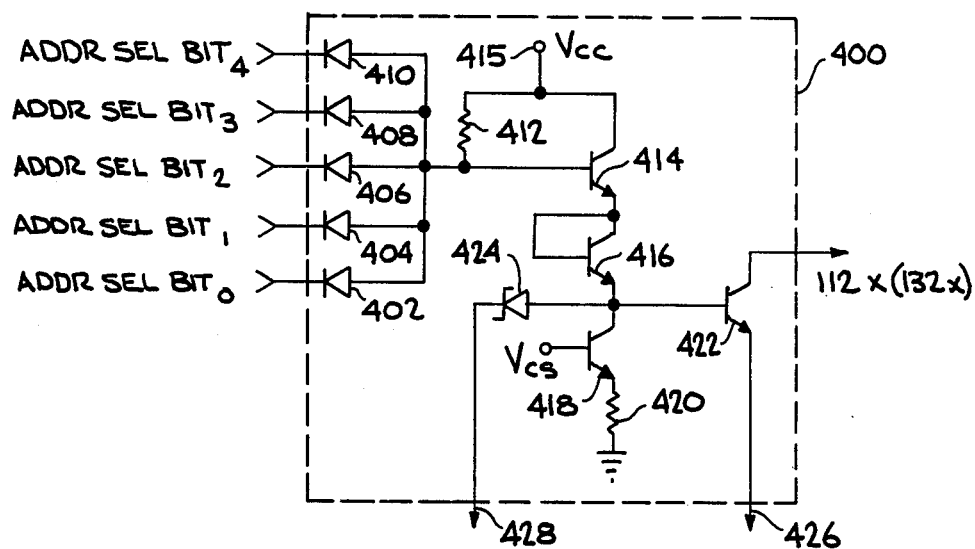
FIG. 5 is a schematic diagram of the row-selection driver circuit, typical of the thirty-two such circuits, used in the A-side and B-side decoder-driver of the present invention.

FIG. 5 illustrates a typical one of the thirty-two row-selection driver circuits 400 which is preferably included in each of the A_DECODER 110 and B_DE- CODER 114 circuits deployed between the address signal lines supplying the high-order 5 bits of the read/write address $A_0A_1A_2A_3A_4$, or $B_0B_1B_2B_3B_4$, to the A_DECODER 110 or B_DECODER 114, and the thirty-two output lines 112a, 112b, ..., 112ff, or 116a, 116b, ..., 116ff.

As illustrated in FIG. 5, the row selection driver 400 of the present invention receives five address-selection bits (ADDR_SEL_BIT$_{0-4}$) which represent a predetermined one of the total of thirty-two possible combinations of the true or complemented five high-order address bits supplied to A_DECODER 110 or B_DECODER 114. I.e., for each "A"-side address bit $A_i$, $0 \leq i \leq 4$, ADDR_SEL_BIT$_i$ is either $A_i$ or $\overline{A}_i$ (or, for each "B"-side address bit $B_i$, $0 \leq i \leq 4$, ADDR_SEL_BIT$_i$, is either $B_i$ or $\overline{B}_i$). Each ADDR_SEL_BIT$_i$, $0 \leq i \leq 4$, signal is connected to the cathode of a corresponding one of five Schottky diodes 402, 404, 406, 408 or 410 and the anodes of the five diodes are connected in common to a "pull-up" resistor 412 and the base of a NPN transistor 414. The other terminal of resistor 412 and the collector of transistor 414 are connected to a voltage source $V_{cc}$, 415.

The effect of diodes 402, 404, 406, 408 and 410 and "pull-up" resistor 412 is to cause transistor 414 to be in a LOW state for thirty-one possible combinations of the five high-order address bits supplied to A_DECODER 110 or B_DECODER 114. Only for the one combination of address bits for which the ADDR_SEL_BIT$_i$, $0 \leq i \leq 4$, are the predetermined true or complemented values which all take on a HIGH level for the one particular five high-order address bits corresponding to the particular row in the array of storage cells of memory 12 containing the storage cells having that 5 high-order address, will cause the transistor 414 be placed into a HIGH state since the cathodes of all five diodes 402, 404, 406, 408 and 410 will be at a HIGH level and will therefore not conduct. Thus one "pull-up" resistor 412 will permit the voltage at the base of transistor 422 to rise to a voltage relatively higher than that of the bases of the other thirty-one deselected transistors 422 located in the thirty-one other row-selection drivers 400.

The emitter of transistor 414 is connected to the base and collector of a level-shifting NPN transistor 416 whose emitter is connected to the collector of an NPN transistor 418 whose emitter is connected to ground via a resistor 420. The base of transistor 418 is connected to a voltage source $V_{cs}$. Transistor 416 and 418 form a standard ECL output portion of the driver circuit 400. At the common connection of the emitter of transistor 416 and collector of transistor 418, the base of an NPN selected-row driver transistor 422 and the anode of a Schottky clamp diode 424 are connected. The collector of driver transistor 422 is connected to one of the A-side row-selected lines 112x (or one of the B-side row select lines 132x). The emitter of driver transistor 422 is connected, via a signal line 426, to the emitters of all the thirty-one corresponding driver transistors of the circuits 400 within A_DECODER 110 (or B_DECODER 114) which combination is connected to an A-side current sink (or a B-side current sink). The cathode of the Schottky clamp diode 424 is connected, via a signal line 428, to the cathodes of all the thirty-one corresponding clamp diodes of the circuits 400 within A_DECODER 110 (or B_DECODER 114) which are connected to ground via an A-side tie-down resistor (or a B-side tie-down resistor). When transistor 414 is in the HIGH state, as described above, current flows from the voltage source $V_{cc}$ 415 through the conducting transistor 414, the level-shifting transistor 416, transistor 418 and resistor 420. The pull-up voltage causes the base of driver transistor 422 to be at a relatively higher voltage than the emitter of transistor 422, which is connected to an A-side current-sinking source during any A-side read/write operation via signal line 426, as are all the row driver transistors in the circuits 400 within A_DECODER 110 (or is connected to a B-side current-sinking source during any B-side read/write operation for all row driver transistors in the circuits 400 within B_DECODER 114). Accordingly, the row select line 112x (or 132x) corresponding to the A-side address received by the A_DECODER (or the B-side address received by the B_DECODER) will be selected by the corresponding conducting row driver transistor 422.

The cathode of Schottky clamp diode 424 is connected to the cathodes of the thirty-one Schottky diodes included in the remaining A-side (or B-side) row driver circuits 400, via signal line 428. The emitter of driver transistor 422 is similarly connected to the emitters of the thirty-one driver transistors included in the remaining A-side (or B-side) row driver circuits 400, via the signal line 428. As will be described hereinafter, the effective parallel interconnection of the thirty-two Schottky diodes 424 forms an equivalent capacitance of approximately 10 picofarads which is sufficient to damp oscillations at the standard ECL output of circuit 400 and thus assure that driver transistor 422 remains conducting so to sink the current via line 112x (or 132x) conducted by the thirty-six storage cells 150 within the selected row of the array within memory 12.

It will be appreciated that only the rowselection driver circuit 400 corresponding to the selected row of the array within memory 12 will need to be capacitively loaded to damp oscillations. The parallel connection of the thirty-two Schottky diodes 424 will be "seen" at the standard ECL output of the selected circuit 400 since all thirty-two diode cathodes are connected via signal line 428. The base-emitter junction of the selected driver transistor 422 is in a conducting state and hence the anode of the Schottky diode 424 of the selected driver circuit 400 is at a higher potential $V_S$ (conducting) relative to line 428.

In each of the remaining unselected row driver circuits 400, at least one of the cathodes of the diodes corresponding to diodes 402, 404, 406, 408 or 410 will be at a LOW level and thus the junction of the pull-up resistor 412 and anode of one of the diodes and the base of transistor 414 will be pulled-down. Accordingly, the transistors corresponding to transistor 414 and 416 are in LOW states, and thus the transistors corresponding to driver transistor 422 are not conducting. The anodes of the thirty-one Schottky diodes in the deselected row driver circuits 400 are held low enough relative to line 428 so that there is not sufficient base voltage to forward bias them, hence they are nonconducting. Only the Schottky diode 424 in the selected row driver circuit is conducting, hence the capacitance of the thirty-two cathodes of 424 only "appears" at the base of the selected driver transistor 422.

We claim:

1. In a dual-access read/write digital storage device having at least two input port means for receiving plural-bit data words, at least two output port means for generating plural-bit data words, dual-access read/write random access memory (RAM) means having a plurality of addressable registers each storing one of said plural-bit data words said RAM means responsive to a first and a second storage register address signal and to a first and a second bi-state read/write signal for coupling said RAM storage register having said first address to a first predetermined one of said input port means or to a first predetermined one of said output port means depending on the state of said first read/write signal and for coupling said RAM storage register having said second address to a second predetermined one of said input port means or to a second predetermined one of said output port means depending on the state of said second read/write signal, whereby, the plural-bit contents of said RAM register selected by said first, said second address signals, respectively, can be communicated to a predetermined one, a predetermined second, respectively, of said at least two output port means and/or replaced by said plural-bit data word at a predetermined one, a predetermined second, respectively, of said at least two input port means.

2. Dual-access read/write RAM means according to claim 1 further including first and second address decode means for receiving said first, said second, address signals, respectively, to generate therefrom a plurality of first row-, second row-, respectively, select signals, wherein said addressable RAM register comprises a plurality of storage cell means responsive to a predetermined one of said first and a predetermined one of said second row-select signals and to said first and said second bi-state read/write signals for storing one bit of said plural-bit data word stored in said register and nondestructively reading said one-bit contents into a predetermined one of said bit positions of said plural-bit data word at a selectable one of said at least two output port means or destructively writing said one-bit contents from a predetermined one of said bit positions of said plural-bit data word at a selectable one of said at least two input port means, depending on said first and second address signals and said bi-state read/write signal.

3. Dual-access read/write RAM means according to claim 2 further including unidirectional plural-conductor busses connecting a corresponding one of each said storage cell means to a corresponding bit position of each said input port means via a true and complemented signal line and to a corresponding bit position of each said output port means via a true and a complemented signal line, and wherein said storage cell means comprises:

first and second NPN flip-flop transistors, connected at a junction of their emitters to a current source, forming a set-reset flip-flop (S-R flip-flop) storage element;

first and second NPN read sense transistors, their collectors connected to said true, respectively, said complemented lines of said conductor of said bus connecting said storage cell means to said corresponding bit position of said first predetermined output port means, and having their bases connected to the base of said first or said second flip-flop transistor, respectively, their emitters responsive to said first row-select signal predetermined;

third and fourth NPN read sense transistors, their collectors connected to said true, respectively, said complemented lines of said conductor of said bus connecting said storage cell means to said corresponding bit position of said second predetermined output port means, and having their bases connected to the base of said first, said second flip-flop transistor, respectively, their emitters responsive to said predetermined second row-select signal;

first and second NPN write transistors, their bases connected to said true, respectively, said complemented lines of said conductors of said bus connecting said storage cell means to said corresponding bit position of said first predetermined input port means, respectively, and having their collectors connected to the base of said first, said second flip-flop transistor, respectively, their emitters responsive to said predetermined first row-select signal;

third and fourth NPN write transistors, their bases connected to said true, respectively, said complemented lines of said conductors of said bus connecting said storage cell means to said corresponding bit position of said second predetermined input port means and having their collectors connected to the base of said first, said second flip-flop transistor, respectively, their emitters responsive to said predetermined second row-select signal, whereby said first, said second, read sense transistor of said storage cell means comprising said RAM register selected by said predetermined first row-select signal conducts a read sense current via said true, respectively, said complemented, signal line of said conductor of said unidirectional bus connected to said first predetermined output means at said collectors if said first flip-flop transistor is presently in a conducting, respectively, non-conducting, state, and fails to conduct said read sense current if said flip-flop transistor is presently in a non-conducting, respectively, conducting, state;

whereby said third, fourth read sense transistor of said storage cell means comprising said RAM register selected by said predetermined second row-select signal conducts a read sense current via said true, respectively, complemented, signal line of said conductor of said unidirectional bus connected to said second predetermined output means at said collectors if said first flip-flop transistor is presently in a conducting, respectively, non-conducting, state, and fails to conduct said read sense current if said flip-flop transistor is presently in a nonconducting, respectively, conducting, state;

whereby said first, said second write, transistor of said storage cell means comprising said RAM register selected by said first row-select signal receives a write current via said true, respectively, said complemented, signal line of said conductor of said unidirectional bus connected to said first predetermined input means at said base of said first said second, respectively, flip-flop transistor thereby causing said first transistor to enter a conducting, respectively, non-conducting, state and said second flip-flop transistor to enter a non-conducting, respectively, conducting, state depending on whether said corresponding bit position of said first predetermined input port means is a ONE, or a ZERO, respectively; and whereby said third, fourth, write transistor of said storage cell means comprising said RAM register selected by said second row-select signal receives a write current via said true respectively, said complemented, signal line of said conductor of said unidirectional bus connected to said second predetermined input means at said base of said first, said second, respectively, flip-flop transistor thereby causing said first transistor to enter a conducting, respectively, non-conducting, state and said second flip-flop transistor to enter a non-conducting, respectively, conducting, state, depending on whether said corresponding bit position of said second predetermined input port means is a ONE, or a ZERO, respectively.

4. Dual-access read/write RAM means according to claim 3 further including a first read, a first write, resistor interconnecting a junction of the emitters of said first and second NPN read sense, respectively, write, transistors and a signal line conducting said first rwo-select signal, and a second read, a second write, resistor interconnecting a junction of the emitters of said third and fourth NPN read sense, respectively, write, transistors and a signal line conducting said second rwo-select signal, whereby, said first row-select signal current divides between the bases of said first and second read sense transistors and said first and second write transistors ("A"-side current "borrowing") in the ratio of the resistance of said first read resistor to the resistance of said first write resistor, and whereby, said second rwo-select signal current divides between said third and fourth read sense transistors and said third and fourth write transistors ("B"-side current "borrowing") in the ratio of the resistance of said second read resistor to the resistance of said second write resistor.

5. Dual-access read/write RAM means according to claim 1 wherein each said addressable plural-bit register comprises a separately-addressable low-order plural-bit portion and a separately-addressable high-order plural-bit portion and wherein said first and second bi-state read/write signal and a bi-state high-order read/write signal, whereby the contents of the low-order portion of said RAM storage register having said first, respectively, second, address is replaced by the low-order portion of said plural-bit data word received at said predetermined one respectively, said second, of said input port means, and/or the contents of the high-order portion of said RAM storage register having said first, respectively, second address is replaced by the high-order portion of said plural-bit data word received at said predetermined one, respectively, said second of said input port means.

6. Dual-access read/write RAM means according to claim 1 further including read/write delayed addressing means for generating said first and said second bi-state read/write signals;

wherein the onset of the HIGH write signal phase of said read/write signal is delayed a predetermined amount in time with respect to the cessation of the HIGH read signal phase ("read-to-write delay") so that the plural-bit contents of said RAM register selected by said first, respectively, said second, address signal to be replaced by said plural-bit data word at said predetermined one, respectively, said second of said at least two input port means does not replace the plural-bit contents of the RAM register means selected by said first, respectively, said second, address signal to be communicated to said predetermined one, respectively, said second of said at least two output port means; and wherein the onset of the HIGH read signal phase of said read/write signal is not delayed in time with respect to the cessation of the HIGH write signal phase ("no write-to-read delay").

7. Dual-access read/write RAM means according to claim 6 wherein said read/write-delayed addressing means includes asymmetrical-delay gate means responsive to transitions of said bi-state read/write signal for providing said "read-to-write delay" and said "no write-to-read delay" comprising: the serial connection of at least two asynchronous unit delay means each having an input terminal and an output terminal for generating after a predetermined time delay a signal at said output terminal equal to the signal applied to said input terminal, a first of said at least two asynchronous unit delay means receiving at said input terminal said bi-state read-write signal, and wired-"OR" gate means having a first input receiving said bi-state read/write signal and having a second input receiving said output signal generated by the last of said serial connector of said asynchronous unit delay means, for generating said "read-to-write delay" and said "no-write-to-read delay" in response to transitions of state of said bi-state read/write signal.

8. Dual access read/write RAM means according to claim 7 wherein said serial connection of said asynchronous unit delay means of said asymmetrical-delay gate means comprises five said asynchronous unit delay means.

9. Dual-access read/write RAM means according to claim 1 wherein said addressable RAM register comprises a plurality of storage cell means responsive to storage cell selection signals and to said first and said second bi-state read/write signals for storing one bit of said plural-bit data word stored in said register means and non-destructively reading said one-bit contents into a predetermined one of said bit positions of said plural-bit data word at a selectable one of said at least two output port means or destructively writing said one-bit contents from predetermined one of said bit positions of said predetermined plural-bit data word at a selectable one of said at least two input port means, depending on said bi-state read/write signal, and wherein said first and said second storage address signals are plural-bit binary-encoded address signals, said dual-access read/write RAM means further including:

first and second address decoding means responsive to said plural-bit binary-encoded address signals for generating a plurality of first and second, respectively, storage register address signals therefrom; and a first and second plurality of driver means responsive to said first, and second, respectively, storage register address signals for generating first, and second, respectively, storage cell selection signals, each said driver means connected to a predetermined addressable set of said storage cell means storing one of said plural-bit data words, wherein each said driver means includes capacitive means for damping oscillations in said storage cell selection signal generated by said driver means, whereby the selection of one of said driver means generating the said storage cell selection signal corresponding to said first, respectively, said second, storage address causes said capacitive means of all said remaining unselected driver means within said first, respectively, said second, plurality of driver means to cooperate with said capacitive means of said selected driver means within said first, respectively, said second, plurality of driver means to selectively capacitively damp oscillations of said generated storage cell selection signal.

10. Dual-access read/write RAM means according to claim 9 wherein each said driver means further includes an NPN driver transistor responsive at its base to said first or said second storage register address signals serving to selectably steer said generated first or said second, respectively, storage cell selection signal, and
wherein said capacitive means comprises a Schottky clamp diode having its anode connected to said base of said NPN driver transistor of its associated said driver means and having its cathode connected in common with the cathodes of all said Schottky clamp diodes of said first or said second plurality of driver means, whereby said driver transistors of said unselected driver means within said first, respectively, second, plurality of driver means are in a non-conducting state and said selected driver transistor within said first, respectively, second plurality of driver means is in a conducting state with the equivalent capacitance of all said clamp diodes connected in parallel coupled to its base to selectively capacitively damp oscillations of said steering of said first, respectively, second storage cell selection signal.

* * * * *